(12) United States Patent
Shung et al.

(10) Patent No.: US 10,268,382 B2
(45) Date of Patent: Apr. 23, 2019

(54) PROCESSOR MEMORY ARCHITECTURE

(71) Applicant: MediaTek Inc., Hsinchu (TW)

(72) Inventors: Chuen-Shen Bernard Shung, San Jose, CA (US); Jonathan Fuchuen Lee, Dublin, CA (US); Zhaoqian Chen, Santa Clara, CA (US); Tom Hsiou-Cheng Kao, Fremont, CA (US)

(73) Assignee: MediaTek Inc., Hsin-Chu (TW)

( * ) Notice: Subject to any disclaimer, the term of this patent is extended or adjusted under 35 U.S.C. 154(b) by 47 days.

(21) Appl. No.: 15/008,772

(22) Filed: Jan. 28, 2016

(65) Prior Publication Data
US 2016/0370998 A1 Dec. 22, 2016

Related U.S. Application Data

(60) Provisional application No. 62/181,425, filed on Jun. 18, 2015.

(51) Int. Cl.
*G06F 3/06* (2006.01)
*G06F 12/06* (2006.01)
(Continued)

(52) U.S. Cl.
CPC ............ *G06F 3/061* (2013.01); *G06F 3/0655* (2013.01); *G06F 3/0685* (2013.01); *G06F 12/0638* (2013.01); *G11C 11/005* (2013.01); *G11C 13/0002* (2013.01); *G11C 13/0021* (2013.01); *G11C 14/0045* (2013.01); *G06F 2212/205* (2013.01)

(58) Field of Classification Search
CPC .... G06F 3/061; G06F 12/0638; G06F 3/0655; G06F 3/0685; G06F 2212/205; G11C 13/0021; G11C 13/0002; G11C 11/005; G11C 14/0045
See application file for complete search history.

(56) References Cited

U.S. PATENT DOCUMENTS 9,269,438 B2 * 2/2016 Nachimuthu
2013/0304981 A1 * 11/2013 Paz ..................... G06F 13/1694
711/105
2014/0297919 A1 10/2014 Nachimuthu et al.

FOREIGN PATENT DOCUMENTS

CN 103019955 A 4/2013

OTHER PUBLICATIONS

DDR4 SDRAM JESD79-4A, Nov. 2013, www.jedec.org.*
(Continued)

*Primary Examiner* — David Yi
*Assistant Examiner* — Zubair Ahmed
(74) *Attorney, Agent, or Firm* — Wolf, Greenfield & Sacks, P.C.

(57) ABSTRACT

A processing device includes a first memory interface for accessing a first memory device of a main memory. Each first memory interface is compatible with Low-Power Double-Data-Rate (LPDDR) signaling. The processing device further includes a second memory interface, which has different signaling characteristics from the first memory interface, for accessing a second memory device of the main memory. The second memory device has an access latency higher than the first memory device and lower than a secondary storage device. The first memory device and the second memory device may be used as a dual memory or a two-tiered memory.

26 Claims, 6 Drawing Sheets

(51) Int. Cl.
*G11C 14/00* (2006.01)
*G11C 13/00* (2006.01)
*G11C 11/00* (2006.01)

(56) References Cited

OTHER PUBLICATIONS

Low Power Double Data Rate 2 JESD209-2F, Jun. 2013, www.jedec.org.*
"LPDDR4—everything you need to know", Apr. 9, 2015.*
Gomony et al., "DRAM Selection and Configuration for Real-time Mobile Systems", in Design, Automation & Test in Europe Conference & Exhibition (Date), 2012, pp. 51-56.*

* cited by examiner

PROCESSOR MEMORY ARCHITECTURE

CROSS-REFERENCE TO RELATED APPLICATIONS

This application claims the benefit of U.S. Provisional Application No. 62/181,425 filed on Jun. 18, 2015.

TECHNICAL FIELD

Embodiments of the invention relate to one or more processors interfaced with a main memory that includes different types of memory devices.

BACKGROUND

A conventional computer system typically includes a hierarchy of memory devices, such as registers, multi-level caches, main memory and secondary storage, in the order from high to low. In general, memory at a higher level of the hierarchy has higher speed (e.g., lower access latency) and lower capacity than memory at a lower level of the hierarchy. The general performance at each level has increased over time.

In conventional computer systems, the main memory is typically implemented by dynamic random access memory (DRAM). One of the commonly-used DRAM-based memory devices is the Double Data Rate Synchronous Dynamic Random-Access Memory (DDR SDRAM), also referred to as DDR. The fourth generation DDR, referred to as DDR4, is one of the latest variants of DRAM that has a high bandwidth interface. DDR4 typically operates at a voltage of 1.2 V with a frequency between 800 and 1600 MHz. As DDR in general offers a large capacity and high bandwidth, it is often the memory of choice in high-performance computers, such as server computers.

Recent advance in memory technology has brought to the market many viable alternatives to DDR. These alternative memory devices may consume lower power, cost less, and/or have higher speed than DDR. Despite these alternatives, DDR usage continues to dominate the existing memory technology. One main reason for the dominance of DDR, especially for high-performance computers, is its large capacity compared to the alternatives.

SUMMARY

In one embodiment, a processing device is provided. The processing device comprises a first memory interface for accessing a first memory device of a main memory. Each first memory interface is compatible with Low-Power Double-Data-Rate (LPDDR) signaling. The processing device further includes a second memory interface, which has different signaling characteristics from the first memory interface, for accessing a second memory device of the main memory.

In another embodiment, a method is provided for a processing device to access a main memory that has a dual memory structure and includes at least two types of memory devices. The method comprises: determining runtime characteristics of a workload executed by the processing device; in response to a determination that the runtime characteristics of the workload belongs to a first category, accessing data of the workload in a first memory device of the main memory via a first memory interface of the processing device, the first memory interface compatible with LPDDR signaling; and in response to a determination that the runtime characteristics of the workload belongs to a second category, accessing data of the workload in a second memory device of the main memory via a second memory interface of the processing device, the second memory interface having different signaling characteristics from the first memory interface.

In another embodiment, a method is provided for a processing device to access a main memory that includes at least two types of memory devices. The method comprises: receiving a request for accessing the main memory, wherein the main memory has a two-tier memory structure in which a first memory device of a first tier serves as a cache for a second memory of a second tier; accessing the first memory device in the main memory via a first memory interface of the processing device when the request results in a hit in the first memory device, the first memory interface compatible with LPDDR signaling; and accessing the second memory device in the main memory via a second memory interface of the processing device when the request results in a miss in the first memory device, the second memory interface having different signaling characteristics from the first memory interface.

In yet another embodiment, a computing system is provided. The computing system comprises: a main memory including at least a first memory device and a second memory device; and one or more processing devices coupled to the main memory. Each of the processing device further comprises: a first memory interface for accessing a first memory device of a main memory, each first memory interface compatible with LPDDR signaling; and a second memory interface, which has different signaling characteristics from the first memory interface, for accessing a second memory device of the main memory.

In yet another embodiment, a processing device is provided. The processing device comprises a first memory interface for accessing a first memory device of a main memory, and a second memory interface for accessing a second memory device of the main memory. Both the first memory device and the second memory device are byte-addressable. Memory access to the first memory device has a lower access latency than memory access to the second memory device for data sizes greater than a predetermined threshold.

In yet another embodiment, a computing system is provided. The computing system comprises a main memory including at least a first memory device and a second memory device, wherein both the first memory device and the second memory device are byte-addressable. The computing system further comprises one or more processing devices coupled to the main memory, each of the processing devices further comprising: a first memory interface for accessing the first memory device; and a second memory interface for accessing the second memory device, wherein memory access to the first memory device has a lower access latency than memory access to the second memory device for data sizes greater than a predetermined threshold.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention enable one or more processors to access a main memory that has at least two different types of memory devices via at least two different types of memory interfaces. In one embodiment, the one or more processors access a first memory device in the main memory via a first memory interface, and access a second memory device in the main memory via a second memory interface different from the first memory interface. In one embodiment, the first memory interface is compatible with LPDDR signaling. In one embodiment, the first memory device is an LPDDR memory device, and the second memory device has an access latency higher than the first memory device and lower than a secondary storage device.

In one embodiment, the second memory interface is a DDR compatible memory interface that enables the one or more processors to access a DDR or DDR compatible memory device. In one embodiment, the one or more processors may be part of a server computer, a cloud computing system, or a high-performance computing system. Alternatively, the one or more processors may be part of a mobile computing system.

For simplicity, the following description refers to a processing device, which may a core, a processor, a cluster, or any number of cores or processors in any number of clusters.

Figure 1:
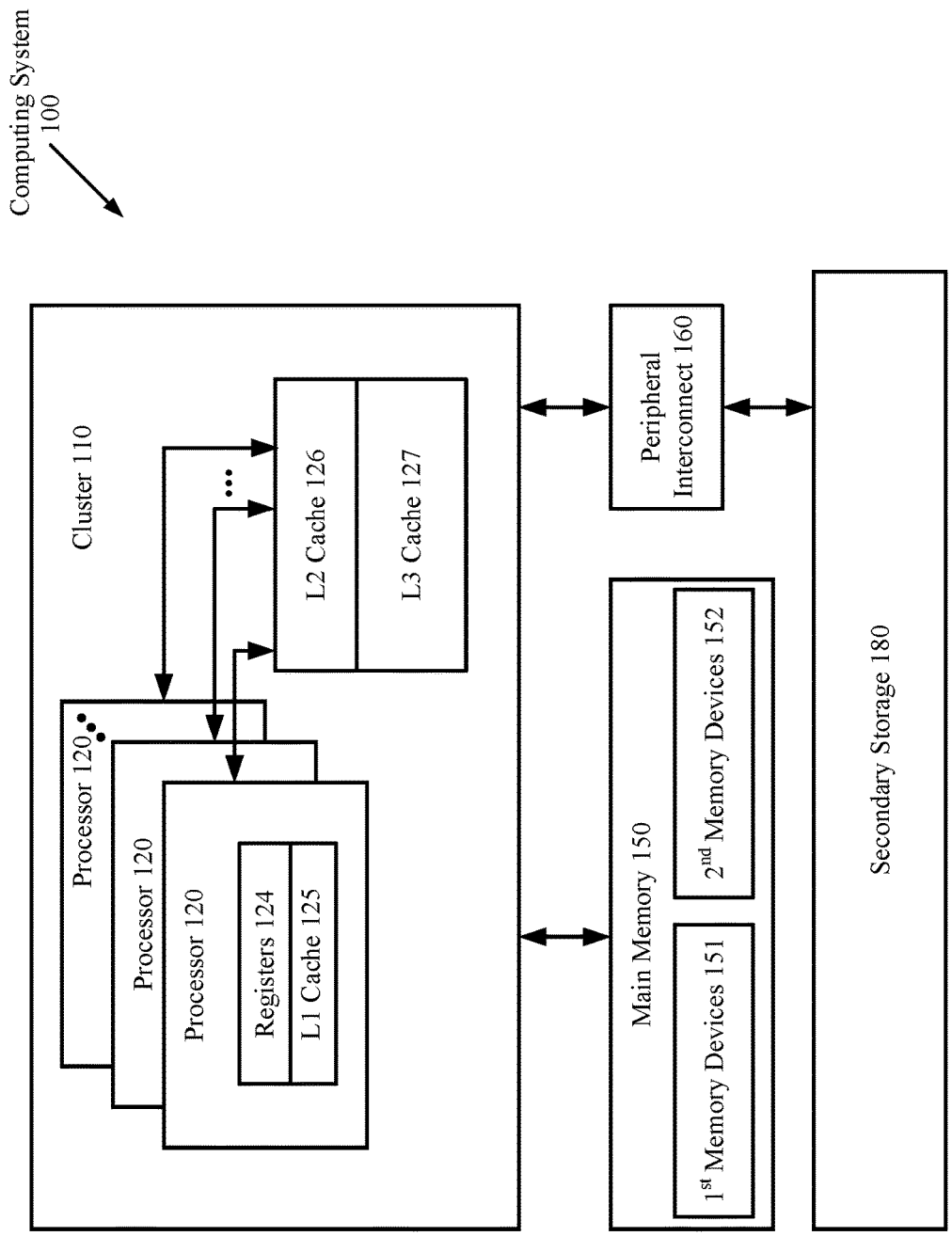
FIG. 1 illustrates an example architecture for a computing system according to one embodiment.

FIG. 1 illustrates a computing system 100 according to one embodiment. The computing system 100 include one or more clusters 110 (one cluster is shown as an example), and each cluster 110 incudes one or more processors 120. In one embodiment, each processor 120 described herein is equivalent to a central processing unit (CPU), which may contain one or more cores. In an alternative embodiment, each processor 110 may be equivalent to a core.

With respect to the memory architecture of the computing system 100, in one embodiment, each processor 110 includes a set of registers 124 and caches (e.g., a level-1 (L1) cache 125). Each processor 110 may also include a number of random access memory (RAM), read-only memory (ROM), and other types of high-speed memory devices on die. Moreover, each cluster 110 also includes caches (e.g., a level-2 (L2) cache 126 and a level-3 (L3) cache 127) shared by the processors 110 of the same cluster. Generally, the registers 124 and the caches 125, 126, 127 are located on the same chip (i.e., die) as the processors 120 and are implemented by high-speed RAM, such as static RAM (SRAM). Although three levels of on-die caches are shown in FIG. 1, the computing system 100 may include any number of levels of on-die caches.

The computing system 100 further includes a main memory 150 accessible by all of the processors 120 via a high-speed connection, and a secondary storage 180 (e.g., a hard disk drive (HDD)) accessible by all of the processors 120 via a peripheral interconnect 160 (e.g., SAS, SATA, etc.). Examples of the secondary storage 180 include, but are not limited to, a magnetic data storage device, an optical data storage device, and a solid-state data storage device. The access latency of the main memory 150 is typically lower than that of the secondary storage 180. The term "access latency" is also referred to as "latency" or "access time." Access latency is inversely proportional to "transfer rate" or "bandwidth." Access latency is the delay in transmitting data between a memory controller and a given memory module (i.e., the time interval between the instant at which a memory controller initiates a request to read or write data, and the instant at which delivery or storage of the data is completed). More specifically, the latency of a typical secondary storage 180 may be in the order of tens of milliseconds, and the latency of the main memory 150 may be several orders lower (e.g., in the order of 100 nanoseconds to a 100 microseconds).

In one embodiment, the main memory 150 include at least two types of memory devices, such as first memory devices 151 and second memory devices 152. The first memory devices 151 and second memory devices 152 have different capacities, different signaling characteristics (e.g., with respect to the number of signaling pins, signal timing and/or signals being transmitted), and different performance characteristics (e.g., with respect to power consumption, latency and/or data transfer rate). Having two different types of memory devices improves overall system performance, as will explained in more detail in connection with FIGS. 3-6. Although two types of memory devices are described herein, it is understood that the main memory 150 may include memory devices of more than two types.

As used herein, a memory device is an integrated circuitry of memory cells on a die. Different types of memory may provide different capacity (number of bytes) on a die. To provide sufficient capacity for the computing system 100, the main memory 150 may contain more than one memory device for each memory type.

Figure 2:
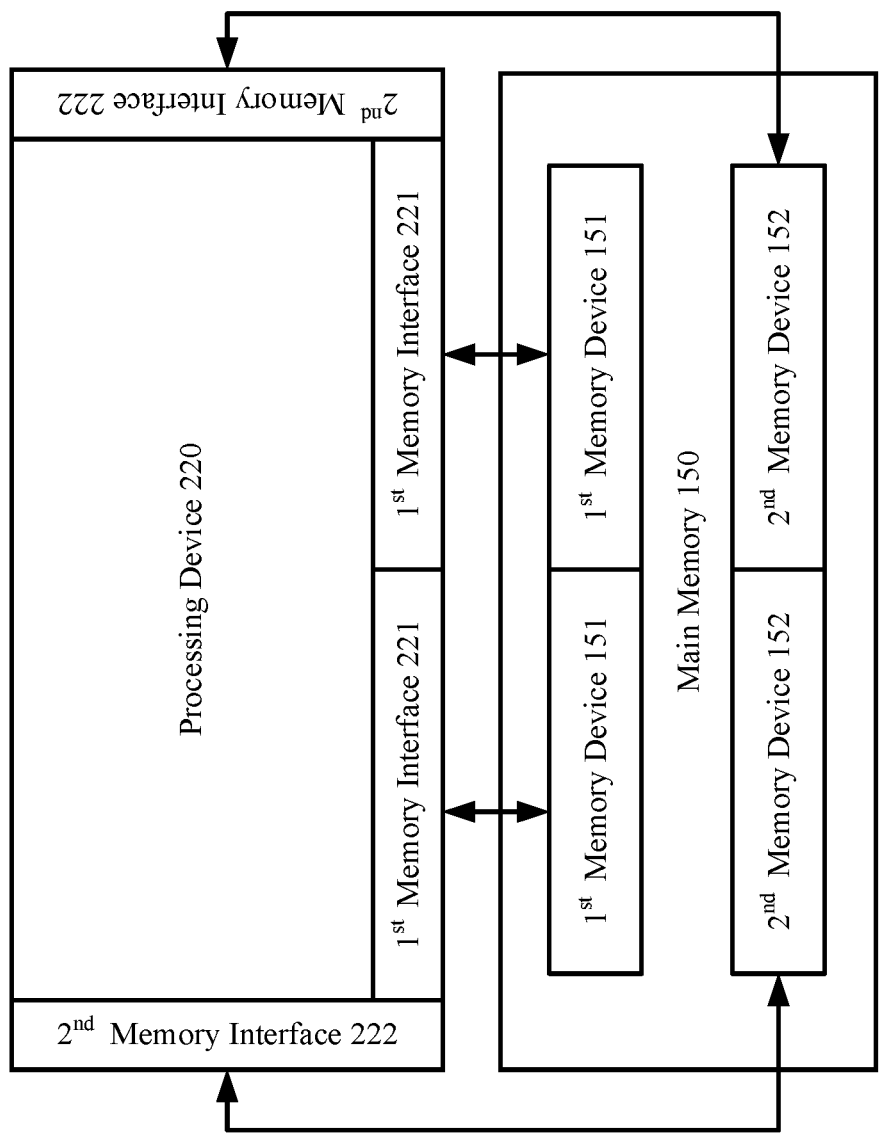
FIG. 2 illustrates a processing device connecting to a main memory according to one embodiment.

FIG. 2 illustrates a processing device 220 connecting to the main memory 150 according to one embodiment. Referring also to FIG. 1, the processing device 220 may be the processor 120, one or more of the cluster 110, or a core within the processor 120 if the processor contains multiple cores. The processing device 220 can access each memory device in the main memory 150 via a corresponding memory interface. That is, the processing device 220 can access each first memory device 151 via a first memory interface 221, and each second memory device 152 via a second memory interface 222. In the example of FIG. 2, the main memory 150 includes two memory devices of each memory type to provide sufficient capacity for the computing system 100. Thus, the processing device 220 also include two memory interfaces of each memory type to correspond to the number of memory devices of each memory type in the main memory 150.

For different types of memory devices, the corresponding memory interfaces may also be different; e.g., different signaling characteristics with respect to the number of signaling pins, signal timing and/or signals being transmitted. For a main memory with more than two types of memory devices, the processing device 220 may include more than two types of memory interfaces to access the corresponding memory devices.

In some embodiments, the differences between the first memory device 151 and the second memory device 152 may include, but are not limited to: access latency, whether the memory device includes a delay-locked loop (DLL) in DRAM, the number of command and address pins, data size per package, topology, maximum frequency, burst length, Reliability-Availability-Serviceability (RAS), VDDQ (i.e., supply voltage to input and output).

For example, in an embodiment where the first memory device 151 is an LPDDR4 (the $4^{th}$ generation of LPDDR) device and the second memory device 152 is a DDR4 device, the differences may include but are not limited to the following: LPDDR4 does not have a DLL in DRAM but DDR4 has at least a DLL; LPDDR4 has 6 signaling pins for command and address but DDR4 has 22 such pins; LPDDR4 data size per package is x16/x32/x64 (where "x" means "times" or "a multiple of" and "/" means "or") but DDR4 data size per package is x4/x8, LPDDR4 topology is point-to-point but DDR4 is a dual-inline memory module (DIMM); the maximum frequency of LPDDR4 is 4266 MT/s but DDR4 is 3200 MT/s (where MT/s means megatransfers per second); the burst length of LPDDR4 is 16 or 32 but DDR4 is 8; LPDDR4 has no RAS support but DDR4 has data cyclic redundancy check (CRC) and command/address parity; LPDDR4 operates VDDQ at 1.1 v but DDR4 operates VDDQ at 1.2 v. Moreover, with respect to the access latency, LPDDR4 outperforms DDR4 for large data transfers; e.g., when the data transfer size is greater than a threshold, e.g., approximately 570 bytes. Thus, LPDDR4 is more suited for I/O intensive workload data and DDR4 is more suited for computation-intensive workload data.

In some embodiments, the first memory device 151 and the second memory device 152 may have a number of similarities despite the aforementioned differences. The similarities may include but are not limited to: byte-addressability, volatile memory, command and address protocols for accessing memory, double data rate architecture (i.e., two data transfers per clock), differential clock inputs and data strobes. An example of such first memory device 151 and second memory device 152 is LPDDR4 and DDR4, respectively. Although LPDDR4 and DDR4 are used as an example, it should be understood that that the first memory device 151 and the second memory device 152 may be any memory devices that has one or more of the aforementioned differences and one or more of the aforementioned similarities.

Figure 3:
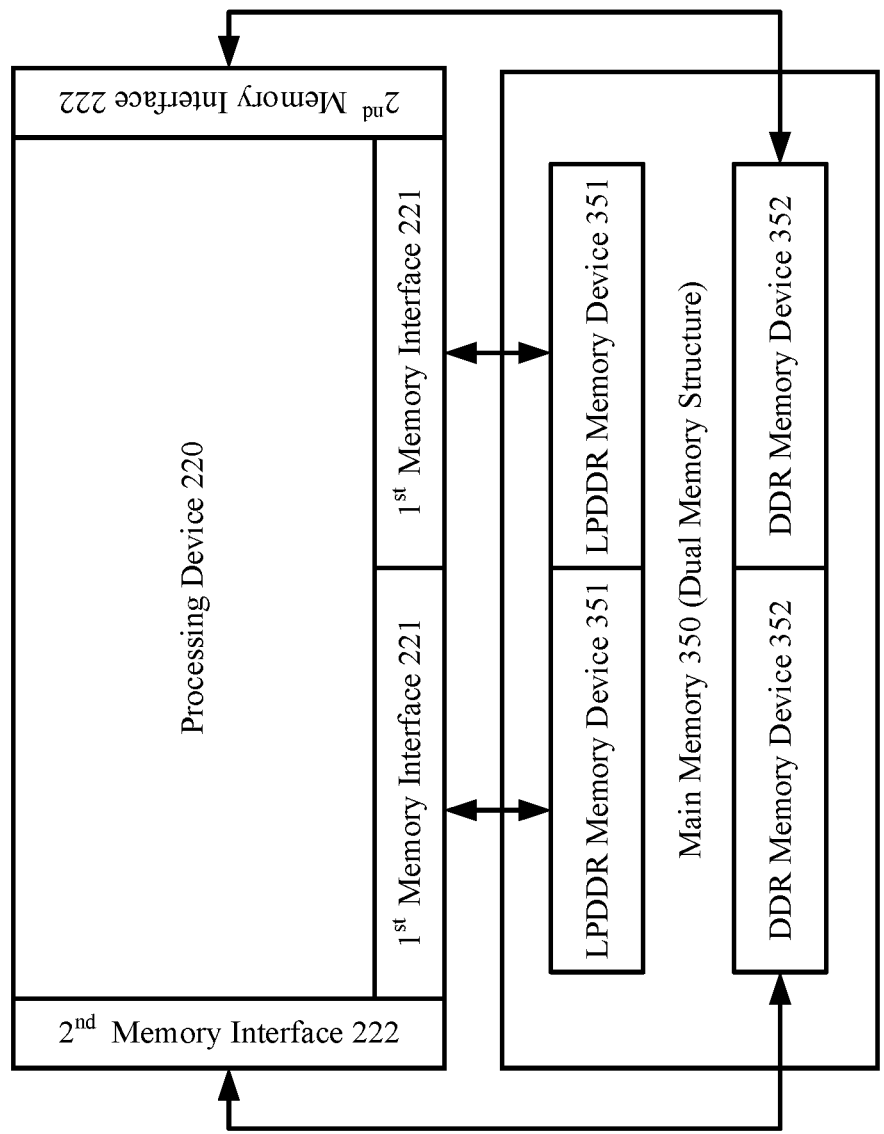
FIG. 3 illustrates a processing device connecting to a main memory having a dual memory structure according to one embodiment.

FIG. 3 illustrates an example of the types of memory devices that may be used in a main memory 350 according to one embodiment. In this embodiment, the first memory device of the main memory 350 may be an LPDDR memory device 351, such as an LPDDR4 or another generation of an LPDDR memory device. In one embodiment, the second memory device of the main memory 350 may be a DDR memory device 352, such as a DDR4 or another generation of a DDR memory device.

LPDDR is a class of SDRAM that operates at a low supply voltage to reduce power consumption. LPDDR has been widely adopted by mobile devices where power consumption is a major concern. As mentioned above, both LPDDR and DDR are byte-addressable, and both are volatile memory devices that require refresh once every few micro-seconds to retain the contents. One advantage of LPDDR is that it consumes less power than the corresponding generation of DDR. For example, the latest generation LPDDR4 may operate at 1.1V, which is lower than DDR4 with a standard voltage at 1.2V. LPDDR4 also supports an improved power saving low frequency mode, which can bring the clock speed down for further battery savings when performing simple background tasks. Experimental results show that LPDDR4 may save 33%-87% power compared to DDR4 in various usage modes such as active pre-charge, active standby, burst read, burst write, etc. Additional similarities and differences between LPDDR4 and DDR4 have been described above.

The processing device 220 may include different types of memory interfaces to access the different types of memory devices 351 and 352. In the embodiment of FIG. 3, the first memory interface 221 handles the signaling between the processing device 220 and the corresponding LPDDR memory device 351, in compliance with the LPDDR interface standard. The second memory interface 222 handles the signaling between the processing device 220 and the corresponding DDR memory device 352, in compliance with the DDR interface standard.

In one embodiment, the LPDDR memory devices 351 and the DDR memory devices 352 may be organized as a dual memory in which the processing device 220 stores data according to the runtime characteristics of the workload. For example, I/O intensive workload data may be stored in the LPDDR memory devices 351 and computation-intensive workload data may be stored in the DDR memory devices 352. As mentioned before, LPDDR is faster (in terms of number of bits per second) than DDR of the same generation for large data transfer sizes (e.g., >570 bytes when comparing LPDDR4 with DDR4). Thus, the LPDDR memory devices 351 are well-suited for high-burst-length access, such as I/O data transfer. For example, when the processing device 220 stores a data block (having a high-burst-length) into the first memory device 151, it may inform an I/O direct memory access (DMA) device to directly access the stored data from the first memory device 151.

By contrast, computation-intensive workload data may need to be accessed frequently in small chunks. As DDR is faster than LPDDR of the same generation for small data transfer sizes (e.g., <570 bytes when comparing LPDDR4 with DDR4), the DDR memory devices 352 are well-suited for computation-intensive random access. In one embodiment, the operating system (OS) that manages resources for the processing device 220 may optimize the access to the two memory devices 351, 352 based on the runtime workload characteristics (e.g., I/O intensive or computation intensive), where the access is via the corresponding first and second memory interfaces 221 and 222 of the processing device 220.

In one embodiment, the two LPDDR memory devices 351 may provide a total of 16 GB capacity and the two DDR memory devices 352 may provide a total of 64 GB-128 GB capacity. In alternative embodiments, the main memory 350 may include different numbers and/or different sizes of the memory devices 351 and 352 according to a capacity requirement. In yet another embodiment where the capacity requirement can be satisfied by the LPDDR memory devices 351 alone, the main memory 350 may include only the LPDDR memory devices 351 to save power and cost. Extra capacity (e.g., provided by the DDR memory devices 352) may be added into the main memory 350 later when there is need for memory expansion.

Figure 4:
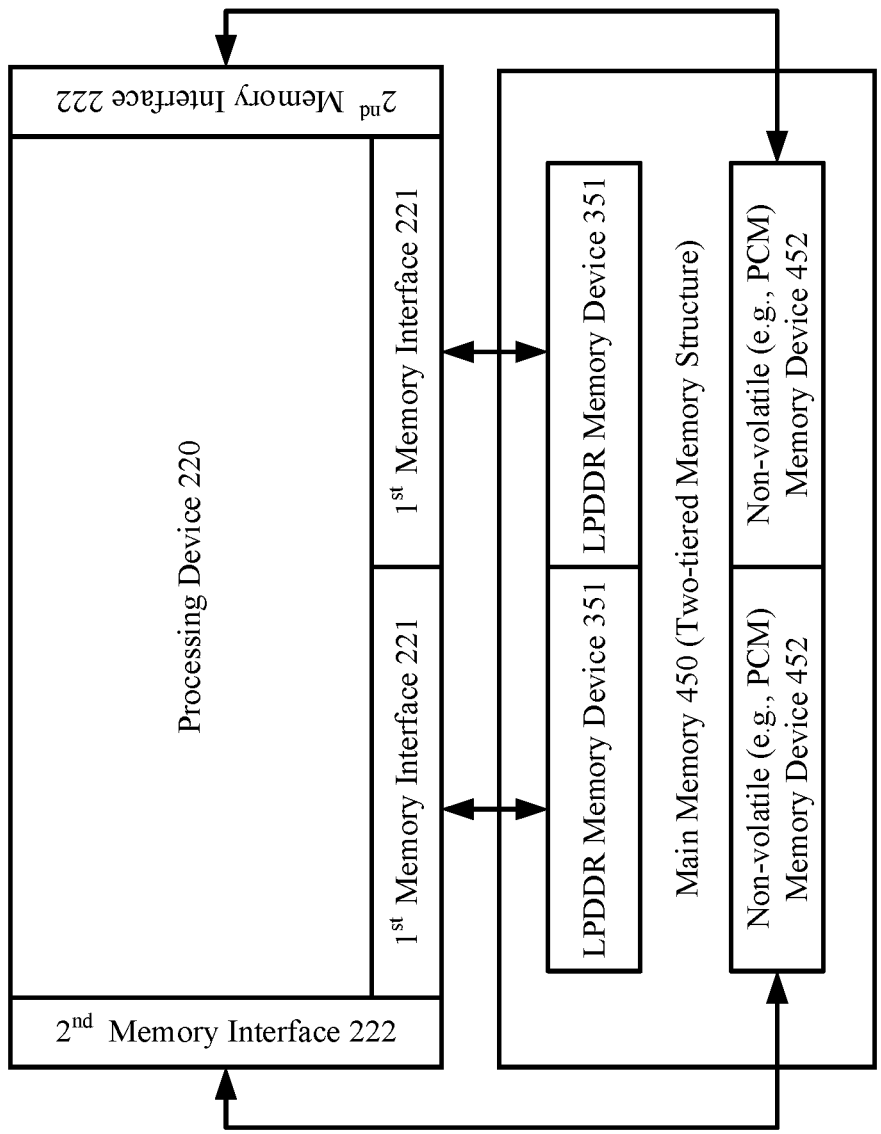
FIG. 4 illustrates a processing device connecting to a main memory having a two-tiered memory structure according to one embodiment.

FIG. 4 illustrates an example of the types of memory devices that may be used in a main memory 450 according to one embodiment. In this embodiment, the first memory device of the main memory 450 may be the LPDDR memory device 351, such as an LPDDR4 (the $4^{th}$ generation) or another generation of an LPDDR memory device. In one embodiment, the second memory device of the main memory 450 may be a non-volatile memory device; e.g., a Phase-Change Memory (PCM) memory device 452.

DRAM-based memory (e.g., DDR and LPDDR) is volatile, which means that data stored in the memory is lost once the power is removed. By contrast, a non-volatile memory retains data even after the power is off. Unlike a volatile memory, a non-volatile memory does not need to have its memory contents periodically refreshed. PCM is a type of non-volatile RAM that exploits the unique behavior of chalcogenide glass. PCM consumes low power, is byte-addressable and has high capacity.

In the embodiment of FIG. 4, the first memory interface 221 handles the signaling between the processing device 220 and the corresponding LPDDR memory device 351, in compliance with the LPDDR interface standard. The second memory interface 222 handles the signaling between the processing device 220 and the corresponding PCM memory device 452, in compliance with the PCM interface standard. In one embodiment, the PCM interface standard defines a signaling mechanism which is compatible with the DDR signaling.

In one embodiment, the LPDDR memory devices 351 and the PCM memory devices 452 may be organized as a two-tiered memory in which the LPDDR memory devices 351 serve as an off-die cache (e.g., a level-4 (L4) cache) for the slower, more power-consuming PCM memory devices 452. In general, PCM memory is slower but offers larger capacity than LPDDR memory. PCM memory can provide a capacity even greater than DDR4 can provide, at lower power and lower costs but higher latency than DDR4. For example, the largest-capacity DDR chip available on the market is 32 Gb per die; by contrast, the smallest-capacity PCM available on the market is 32 Gb per die. In one embodiment, the OS that manages resources for the processing device 220 may optimize the usage to the two memory devices 351, 452 based on a cache write policy (e.g., write-back, write-through, etc.) and a cache replacement policy (e.g., least recently-used, first-in-first-out, etc.), where the memory access is via the corresponding first and second memory interfaces 221 and 222 of the processing device 220.

In one embodiment, the two LPDDR memory devices 351 may provide a total of 16 GB capacity and the two PCM memory devices 452 may provide a total of 256 GB capacity. In alternative embodiments, the main memory 450 may include different numbers and/or different sizes of the memory devices 351 and 452 according to a capacity requirement. In yet another embodiment where the capacity requirement can be satisfied by the LPDDR memory devices 351 alone, the main memory 450 may include only the LPDDR memory devices 351 to save power and cost. Extra capacity (e.g., provided by the PCM memory devices 452) may be added into the main memory 450 later when there is need for expansion.

Referring back to FIG. 2, in alternative embodiments, the first memory device 151 of the main memory 150 may be an LPDDR memory device for its high speed and low power, and the second memory device 152 may be a 3D XPoint™ memory device. A 3D XPoint™ memory device is a non-volatile, high-speed and high-capacity random access memory device, which may complement the low-power characteristics of the LPDDR memory device. A 3D XPoint™ memory device has transistor-less cross-point architecture that creates a three-dimensional checkerboard where memory cells sit at the intersection of word lines and bit lines, allowing the cells to be addressed individually.

In yet another embodiment, the first memory device 151 of the main memory 150 may be an LPDDR memory device, and the second memory device 152 may be a resistive random access memory (RRAM) device, which works by changing the resistance across a dielectric solid-state material often referred to as a memristor. A RRAM device is a non-volatile, high-speed and high-capacity random access memory device, which may complement the low-power characteristics of the LPDDR memory device. In yet another embodiment, the first memory device 151 of the main memory 150 may be an LPDDR memory device, and the second memory device 152 may be a variant of a DDR, PCM, 3D XPoint™, or RRAM memory device; or any type of memory that provides greater capacity than LPDDR at the expense of costs or other performance characteristics such as latency, transfer rate and/or power consumption. In one embodiment, the second memory device 152 may be based on any memory technology that provides greater capacity than LPDDR and has a latency in the range of a few microseconds (i.e., slower than or comparable to LPDDR) to a few milliseconds (i.e., faster than HDDs).

Figure 5:
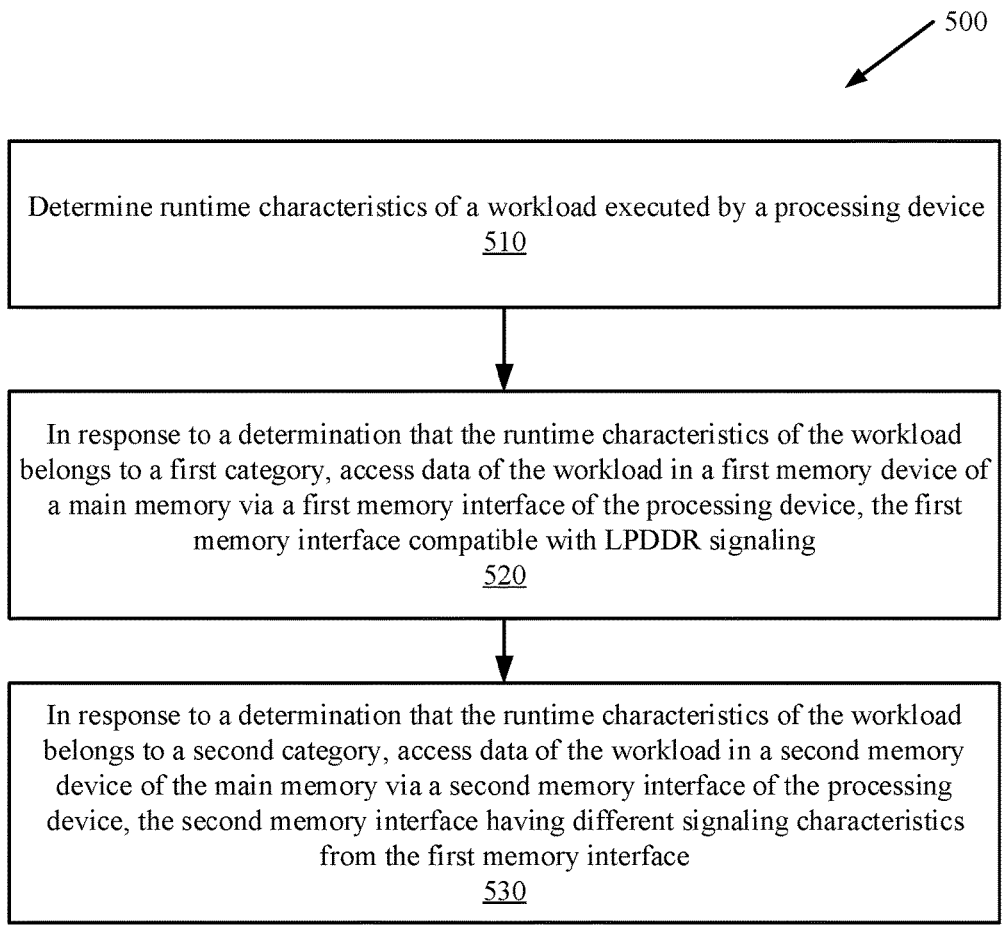
FIG. 5 is a flow diagram illustrating a method for a processing device to access a main memory having a dual memory structure according to one embodiment.

FIG. 5 is a flow diagram illustrating a method 500 for a processing device (e.g., the processing device 220 of FIG. 3) to access a main memory that has a dual memory structure and includes at least two types of memory devices according to one embodiment. An example of the main memory is the main memory 350 having the dual memory structure shown in FIG. 3. In one embodiment, the processing device is part of a computing system, such as the computing system 100 of FIG. 1.

The method 500 begins when, at step 510, the processing device determines runtime characteristics of a workload executed by the processing device. The determination may be made by an OS running on the computing system for optimizing the main memory usage. If the runtime characteristics of the workload belongs to a first category, at step 520 the processing device accesses data of the workload in a first memory device of the main memory via a first memory interface of the processing device, the first memory interface compatible with LPDDR signaling. If the runtime characteristics of the workload belongs to a second category, at step 530 the processing device accesses data of the workload in a second memory device of the main memory via a second memory interface of the processing device, the second memory interface having different signaling characteristics from the first memory interface. In one embodiment, the first category of the runtime characteristics includes high-burst-length data access (e.g., I/O intensive), and the second category of the runtime characteristics includes computation-intensive random access of data. In the embodiment of FIG. 3, the second memory interface provides a DDR or DDR-compatible signaling interface.

It is understood that the steps 520 and 530 may be performed in any order, sequentially or in parallel. In one embodiment, the main memory includes one or more first memory devices that are LPDDR memory devices. In one embodiment, the main memory includes one or more second memory devices that are DDR memory devices, or other volatile or non-volatile memory devices having a signaling mechanism compatible to that of DDR. In one embodiment, the processing device is a core, a processor, or a cluster of processors or cores. In one embodiment, the processing device is part of a computing system that is server computer or other types of high-performance computers.

Figure 6:
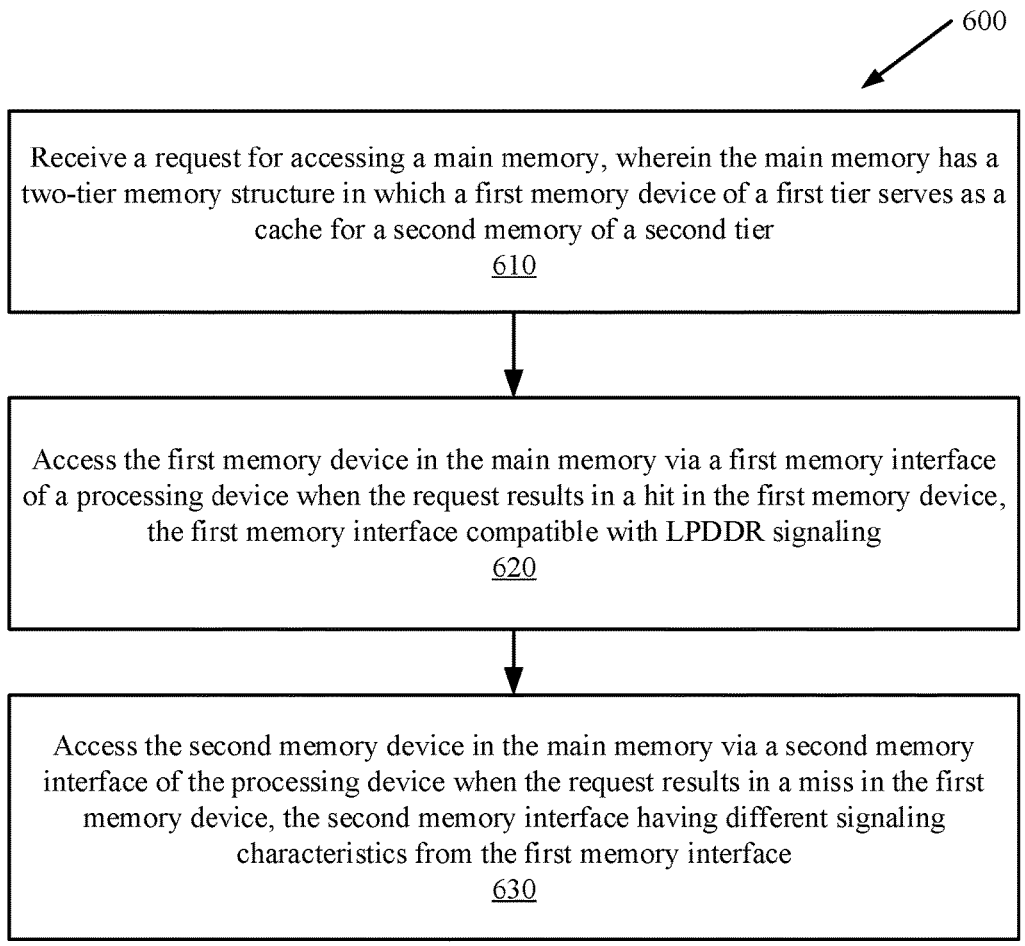
FIG. 6 is a flow diagram illustrating a method for a processing device to access a main memory having a two-tiered memory structure according to another embodiment.

FIG. 6 is a flow diagram illustrating a method 600 for a processing device (e.g., the processing device 220 of FIG. 4) to access a main memory that includes at least two types of memory devices according to one embodiment. An example of the main memory is the main memory 450 having the two-tiered memory structure shown in FIG. 4, where the first memory device serves as a cache for the second memory device. In one embodiment, the processing device is part of a computing system, such as the computing system 100 of FIG. 1.

The method 600 begins when, at step 610, the processing device receives a request for accessing the main memory, where the main memory has a two-tier memory structure in which a first memory device of a first tier serves as a cache for a second memory of a second tier. As an example, the request may be due to a miss when the processing device reads from an on-die cache (e.g., L1, L2 or L3 cache), or when an on-die cache line is to be written back to the main memory. The processing device at step 620 accesses a first memory device in the main memory via a first memory interface of the processing device when the request results in a hit in the first memory device, where the first memory interface is compatible with LPDDR signaling. The processing device at step 630 accesses a second memory device in the main memory via a second memory interface of the processing device when the request results in a miss in the first memory device, where the second memory interface has different signaling characteristics from the first memory interface. In the embodiment of FIG. 4, the first memory interface provides access to an LPDDR memory device and the second memory interface provides access to a non-volatile memory device such as a PCM memory device. In alternative embodiments, the second memory interface may provide access to other volatile or non-volatile memory device such as 3D-XPoint™, RRAM, or other comparable memory devices.

It is understood that the steps 620 and 630 may be performed in any order, sequentially or in parallel. In one embodiment, the main memory includes one or more first memory devices that are LPDDR memory devices. In one embodiment, the processing device is a core, a processor, or a cluster of processors or cores. In one embodiment, the processing device is part of a computing system that is server computer or other types of high-performance computers.

The operations of the flow diagrams of FIGS. 5 and 6 have been described with reference to the exemplary embodiments of FIGS. 1-4. However, it should be understood that the operations of the flow diagrams of FIGS. 5 and 6 can be performed by embodiments of the invention other than those discussed with reference to FIGS. 1-4, and the embodiments discussed with reference to FIGS. 1-4 can perform operations different than those discussed with reference to the flow diagrams. While the flow diagrams of FIGS. 5 and 6 show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A processing device comprising:
   a first memory interface for accessing a first memory device of a main memory, the first memory interface compatible with Low-Power Double-Data-Rate (LPDDR) signaling;
   a second memory interface, which has different signaling characteristics from the first memory interface, for accessing a second memory device of the main memory, wherein the second memory device is different from an LPDDR memory device; and
   one or more processors coupled to the first memory interface and the second memory interface, the one or more processors operative to:
      determine whether data transfer sizes incurred by a first workload are greater than a predetermined threshold;
      store data of the first workload in the first memory device when the one or more processors determine that the data transfer sizes incurred by the first workload are greater than a predetermined threshold;
      determine whether data transfer sizes incurred by a second workload are greater than the predetermined threshold; and
      store data of the second workload in the second memory device when the one or more processors determine that the data transfer sizes incurred by the second workload are not greater than the predetermined threshold,
   wherein the predetermined threshold of a data transfer size is determined by comparing access latency of the first memory device and the second memory device.

2. The processing device of claim 1, wherein the second memory interface is compatible with Double-Data-Rate (DDR) signaling.

3. The processing device of claim 1, wherein the second memory device includes a nonvolatile random-access memory (RAM) device.

4. The processing device of claim 3, wherein the nonvolatile RAM device includes at least one of: a Phase Change Memory (PCM) device, a 3D XPoint memory device, and a Resistive RAM device.

5. A method for a processing device to access a main memory that has a dual memory structure and includes at least two types of memory devices, comprising:
   the processing device determining runtime characteristics of a workload executed by the processing device by determining whether data transfer sizes of the workload exceed a threshold;
   in response to a determination that the runtime characteristics of the workload belongs to a first category, accessing data of the workload in a first memory device of the main memory via a first memory interface of the processing device, the first memory interface compatible with Low-Power Double-Data-Rate (LPDDR) signaling; and
   in response to a determination that the runtime characteristics of the workload belongs to a second category, accessing data of the workload in a second memory device of the main memory via a second memory interface of the processing device, the second memory interface having different signaling characteristics from the first memory interface, wherein the second memory device is different from an LPDDR memory device, wherein the runtime characteristics of the workload belongs to the first category when the data transfer sizes of the workload exceed the threshold, and to the second category when the data transfer sizes do not exceed the threshold, and wherein the threshold of a data transfer size is determined by comparing access latency of the first memory device and the second memory device.

6. The method of claim 5, wherein the first category of the runtime characteristics includes high-burst-length data access, wherein one or more burst lengths of data access exceed a burst-length threshold.

7. The method of claim 5, wherein the first category of the runtime characteristics includes I/O intensive random access of data, and the second category of the runtime characteristics includes computation-intensive random access of data.

8. The method of claim 5, wherein the second memory interface is compatible with Double-Data-Rate (DDR) signaling.

9. The method of claim 5, wherein the second memory device includes a nonvolatile random-access memory (RAM) device.

10. The method of claim 9, wherein the nonvolatile RAM device includes at least one of: a Phase Change Memory (PCM) device, a 3D XPoint memory device, and a Resistive RAM device.

11. A computing system comprising:
a main memory including at least a first memory device and a second memory device; and
one or more processing devices coupled to the main memory, each of the processing device further comprising:
a first memory interface for accessing a first memory device of a main memory, the first memory interface compatible with Low-Power Double-Data-Rate (LPDDR) signaling;
a second memory interface, which has different signaling characteristics from the first memory interface, for accessing a second memory device of the main memory, wherein the second memory device is different from an LPDDR memory device,
one or more processors coupled to the first memory interface and the second memory interface, the one or more processors operative to:
determine whether data transfer sizes incurred by a first workload are greater than a predetermined threshold;
store data of the first workload in the first memory device when the one or more processors determine that the data transfer sizes incurred by the first workload are greater than a predetermined threshold;
determine whether data transfer sizes incurred by a second workload are greater than the predetermined threshold; and
store data of the second workload in the second memory device when the one or more processors determine that the data transfer sizes incurred by the second workload are not greater than the predetermined threshold, wherein the predetermined threshold of a data transfer size is determined by comparing access latency of the first memory device and the second memory device.

12. The computing system of claim 11, wherein the second memory interface is compatible with Double-Data-Rate (DDR) signaling.

13. The computing system of claim 11, wherein the second memory device includes a nonvolatile random-access memory (RAM) device.

14. The computing system of claim 13, wherein the nonvolatile RAM device includes at least one of: a Phase Change Memory (PCM) device, a 3D XPoint memory device, and a Resistive RAM device.

15. A processing device comprising:
a first memory interface for accessing a first memory device of a main memory;
a second memory interface for accessing a second memory device of the main memory, wherein both the first memory device and the second memory device are byte-addressable, and wherein the second memory device is different from an LPDDR memory device; and
one or more processors coupled to the first memory interface and the second memory interface, the one or more processors operative to:
determine whether data transfer sizes incurred by a first workload are greater than a predetermined threshold;
store data of the first workload in the first memory device when the one or more processors determine that the data transfer sizes incurred by the first workload are greater than a predetermined threshold;
determine whether data transfer sizes incurred by a second workload are greater than the predetermined threshold; and
store data of the second workload in the second memory device when the one or more processors determine that the data transfer sizes incurred by the second workload are not greater than the predetermined threshold,
wherein the predetermined threshold of a data transfer size is determined by comparing access latency of the first memory device and the second memory device.

16. The processing device of claim 15, wherein the first memory device and the second memory device are both volatile memory devices and have a double data rate architecture.

17. The processing device of claim 15, wherein the first memory device has no delay-locked loop (DLL) and the second memory device has at least a DLL.

18. The processing device of claim 15, wherein the first memory device and the second memory device have different numbers of signaling pins for command and address.

19. The processing device of claim 15, wherein the first memory device and the second memory device have different supply voltages for input and output.

20. The processing device of claim 15, wherein the first memory device is used for I/O intensive workload data and the second memory device is used for computation-intensive workload data.

21. A computing system comprising:
a main memory including at least a first memory device and a second memory device, wherein both the first memory device and the second memory device are byte-addressable, and wherein the second memory device is different from an LPDDR memory device; and one or more processing devices coupled to the main memory, each of the processing devices further comprising:
- a first memory interface for accessing the first memory device;
- a second memory interface for accessing the second memory device; and
- one or more processors coupled to the first memory interface and the second memory interface, the one or more processors operative to:
- determine whether data transfer sizes incurred by a first workload are greater than a predetermined threshold;
- store data of the first workload in the first memory device when the one or more processors determine that the data transfer sizes incurred by the first workload are greater than a predetermined threshold;
- determine whether data transfer sizes incurred by a second workload are greater than the predetermined threshold; and
- store data of the second workload in the second memory device when the one or more processors determine that the data transfer sizes incurred by the second workload are not greater than the predetermined threshold, wherein the predetermined threshold of a data transfer size is determined by comparing access latency of the first memory device and the second memory device.

22. The computing system of claim 21, wherein the first memory device and the second memory device are both volatile memory devices and have a double data rate architecture.

23. The computing system of claim 21, wherein the first memory device has no delay-locked loop (DLL) and the second memory device has at least a DLL.

24. The computing system of claim 21, wherein the first memory device and the second memory device have different numbers of signaling pins for command and address.

25. The computing system of claim 21, wherein the first memory device and the second memory device have different supply voltages for input and output.

26. The computing system of claim 21, wherein the first memory device is used for I/O intensive workload data and the second memory device is used for computation-intensive workload data.

* * * * *